(12) United States Patent
Cheng et al.

(10) Patent No.: US 9,500,674 B2
(45) Date of Patent: Nov. 22, 2016

(54) PROBE STRUCTURE

(71) Applicant: C.C.P. CONTACT PROBES CO., LTD., New Taipei (TW)

(72) Inventors: Yu-Min Cheng, New Taipei (TW); You-Yu Lo, New Taipei (TW); Chien-Yu Hsieh, New Taipei (TW)

(73) Assignee: C.C.P. CONTACT PROBES CO., LTD., New Taipei (TW)

( * ) Notice: Subject to any disclaimer, the term of this patent is extended or adjusted under 35 U.S.C. 154(b) by 130 days.

(21) Appl. No.: 14/613,375

(22) Filed: Feb. 4, 2015

(65) Prior Publication Data

US 2016/0223585 A1 Aug. 4, 2016

(51) Int. Cl.
*G01R 1/067* (2006.01)

(52) U.S. Cl.
CPC ....... *G01R 1/06716* (2013.01); *G01R 1/06722* (2013.01)

(58) Field of Classification Search
CPC .............. G01R 1/06716; G01R 1/06722
USPC ............ 324/754.01, 754.03, 754.08, 755.04, 324/755.05, 755.08, 755.11, 756.01, 756.04
See application file for complete search history.

(56) References Cited

U.S. PATENT DOCUMENTS

| 7,969,170 B2 * | 6/2011 | Kazama ............. G01R 1/06772 324/754.01 |
| 2008/0100325 A1 * | 5/2008 | Sinclair .............. G01R 1/06722 324/755.05 |

FOREIGN PATENT DOCUMENTS

JP    WO 2013035399 A1 *  3/2013   ......... H01R 13/2421

* cited by examiner

*Primary Examiner* — Christopher Mahoney
(74) *Attorney, Agent, or Firm* — Leong C. Lei

(57) ABSTRACT

A probe structure includes a sleeve, a needle shaft and an elastic member. The needle shaft is accommodated in the sleeve and includes a first groove for accommodating the elastic member. The probe structure further includes a conductive component installed at the bottom of the sleeve and having an end connected into the first groove, and a second groove, so that the elastic member is situated in the first and second grooves. When the needle shaft is pressed and moved, the inner wall of the second groove is contacted with an outer sidewall of the conductive component to define a second conductive channel. With the two conductive channels, the effects of maintaining stable current transmission efficiency, reducing poor contact or disconnection, and providing good structural stability are achieved.

5 Claims, 4 Drawing Sheets

PROBE STRUCTURE

BACKGROUND OF THE INVENTION

1. Field of the Invention

The present invention relates to a current transmission component, and more particularly to a probe structure having two current transmission paths and high structural stability.

2. Description of the Related Art

At present, various types of electronic circuit components in an electronic device generally use a probe for connecting the components. In addition, related electrical testing procedures are conducted to ensure the functionality of the electronic circuit components after the electronic components are manufactured. In an electrical testing procedure, different parameters of the electronic circuit components are tested, wherein a probe is generally used for testing the conduction status of the electronic circuit component. In the area of electronic components and devices, products such as Pogo Pin use a probe structure as a connector for connecting various types of electronic circuit components, or as a detector for conducting an electrical test of the electronic circuit components. Regardless of being used for a detector or connector, the probe structure must take its electric conductive status as a major factor into consideration.

For example, a conventional probe structure used as a connector comprises a sleeve, a needle shaft and an elastic member, and an opening is formed on a side of the sleeve, and the other side of the sleeve is sealed. The needle shaft have a groove, and elastic member installed in the groove, such that after the needle shaft is pressed, an inner wall of the sleeve is in contact with the needle shaft to define a conductive channel, and the needle shaft resumes its original position by a reverse elasticity of the elastic member, so that current can be transmitted to the electronic components through the conductive channel.

However, the needle shaft may be separated from the sleeve easily by external vibrations produced during the process of operating the needle shaft of the aforementioned probe structure, so that the conductive channel may be affected to cause poor contact or disconnection. As electronic components become smaller and smaller, the probe structure must be miniaturized. Therefore, finding a way of overcoming the drawbacks of the conventional probe structure in such as small structure and improving the efficiency and performance of electric conduction demands immediate attention and feasible solutions.

Therefore, the inventor of the present invention designed and developed a probe structure in accordance with the present invention to overcome the aforementioned drawbacks and problems of the conventional probe structure.

SUMMARY OF THE INVENTION

In view of the problems of the prior art, it is a primary objective of the present invention to overcome the problems of the prior art by providing a probe structure used as an electric connector or tester for a miniaturized production, and two current transmission paths are provided to improve the current transmission efficiency and extend the service life of the probe structure, while providing a good structural stability.

To achieve the aforementioned objective, the present invention provides a probe structure comprising a sleeve, a needle shaft and an elastic member, and the sleeve having an opening formed at an end and being sealed at the other end, and the needle shaft being accommodated in the sleeve and having a first groove, and an end of the elastic member being accommodated in the first groove, and the needle shaft being pressed to contact with an inner wall of the sleeve to define a first conductive channel, characterized in that the probe structure further comprises a conductive component installed at the bottom of the sleeve and having an end disposed in the first groove and a second groove concavely formed on the conductive component, such that the elastic member is disposed in the first groove and the second groove simultaneously, and when the needle shaft is pressed and moved, an inner sidewall of the second groove is in contact with an outer sidewall of the conductive component to define a second conductive channel.

Wherein, the needle shaft has a first contact portion disposed at an end opposite to the end of the needle shaft having the first groove, and the first contact portion is in a convex arc shape. When the probe structure of the present invention is applied to a lateral connector or tester, its convex arc shape improves the stability of a lateral contact force with respect to the needle shaft. In addition, the conductive component includes a second contact portion disposed at an end opposite to an end of the conductive component having the second groove, and contacted with a bottom surface of the sleeve, and a conductive slot is formed on a bottom surface of the sleeve and corresponsive to the second contact portion to improve the contact stability of the second conductive channel.

With the aforementioned technical characteristics, the probe structure achieves the effects of maintaining stable current transmission efficiency and reducing poor contact caused by external vibrations to improve the using efficiency by the first conductive channel and the second conductive channel. In addition, the present invention also adopts a miniaturized design to cope with applications for various types of micro electronic components, and the structural characteristics of the present invention still maintains the structural stability and using efficiency and extends the service life effectively for the micro components.

DETAILED DESCRIPTION OF THE PREFERRED EMBODIMENTS

Figure 1:
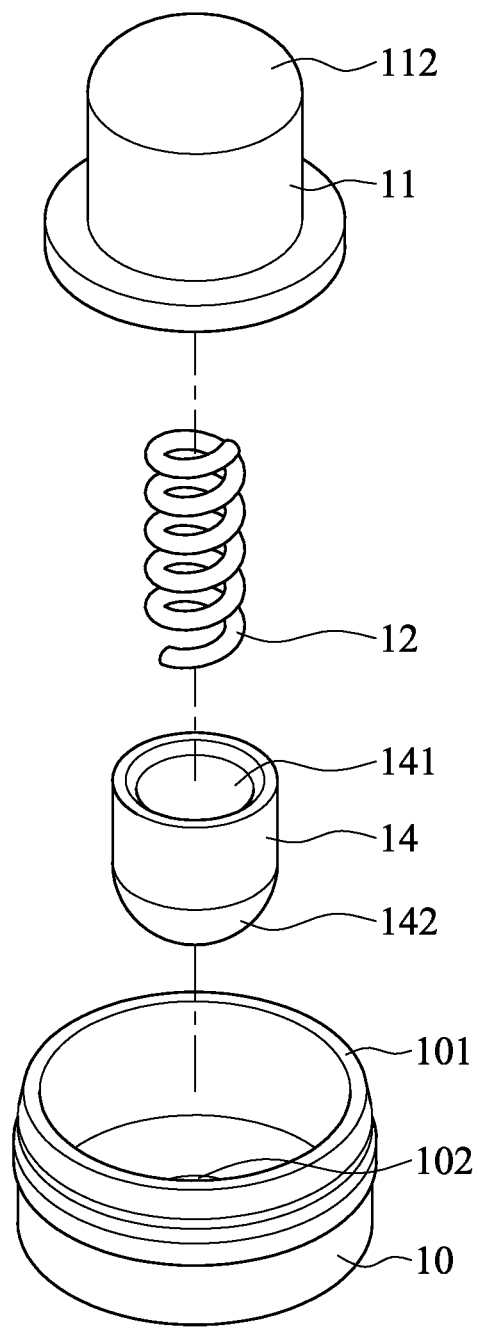
FIG. 1 is an exploded view of a preferred embodiment of the present invention.
Figure 2:
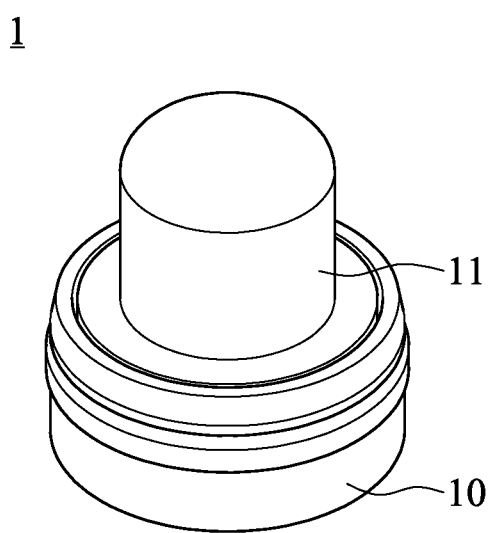
FIG. 2 is a schematic view of a probe structure of a preferred embodiment of the present invention.

The technical content of the present invention will become apparent with the detailed description of preferred embodiments and the illustration of related drawings as follows.

With reference to FIGS. 1, 2 and 3-4 for an exploded view, a perspective view and schematic views of a probe structure in accordance with a preferred embodiment of the present invention respectively, the probe structure 1 comprises a sleeve 10, a needle shaft 11 and an elastic member 12, wherein an opening 101 is formed at an end of the sleeve 10, and the other end of the sleeve 10 is sealed, and the needle shaft 11 is accommodated in the sleeve 10 and includes a first groove 111 concavely formed at an end of the needle shaft 11, and the elastic member 12 is accommodated in the first groove 111, such that when the needle shaft 11 is pressed, the needle shaft 11 is in contact with an inner of the sleeve 10 to define a first conductive channel 13.

The present invention is characterized in that the probe structure 1 further comprises a conductive component 14 installed at the bottom of the sleeve 10 and having an end of disposed in the first groove 111, and a second groove 141, such that after the assembling, an end of the elastic member 12 is disposed in the first groove 111, and the other end of the elastic member 12 is disposed in the second groove 141. After the needle shaft 11 is pressed and moved towards the bottom of the sleeve 10, an inner sidewall of the first groove 111 and an outer sidewall of the conductive component 14 form a second conductive channel 15. In practical applications, the probe structure 1 achieves the effects of enhancing the current transmission path, and reducing poor contact or disconnection caused by external vibrations by means of the first conductive channel 13 and the second conductive channel 15

Wherein, the needle shaft 11 includes a first contact portion 112 disposed at an end opposite to the end of the needle shaft 11 having the first groove 111, and the first contact portion 112 is preferably in a convex arc shape. The first contact portion 112 acts as a contacting and force exerting end. In other words, the first contact portion 112 is provided for contacting external components when the probe structure 1 is used as a connector or a tester.

The conductive component 14 includes a second contact portion 142 disposed at an end opposite to the end of the conductive component 14 having the second groove 141 and normally contacted with the bottom side of the sleeve 10, and a conductive slot 102 formed on a bottom surface of the sleeve 10 and corresponsive to the second contact portion 142, and provided for securing the conductive component 14 and the needle shaft 11. After the needle shaft 11 is pressed and moved, current passes from the first contact portion 112 through the needle shaft 11 and the conductive component 14 to the second contact portion 142 and the conductive slot 102 to define the second conductive channel 15. Since the elastic member 12 is a spring, the elastic member 12 not just provides a reverse restoring force to the pressed needle shaft 11 only, but also shares the direct force exertion on the needle shaft 11 to extend the service life of the probe structure 1.

Figure 3:
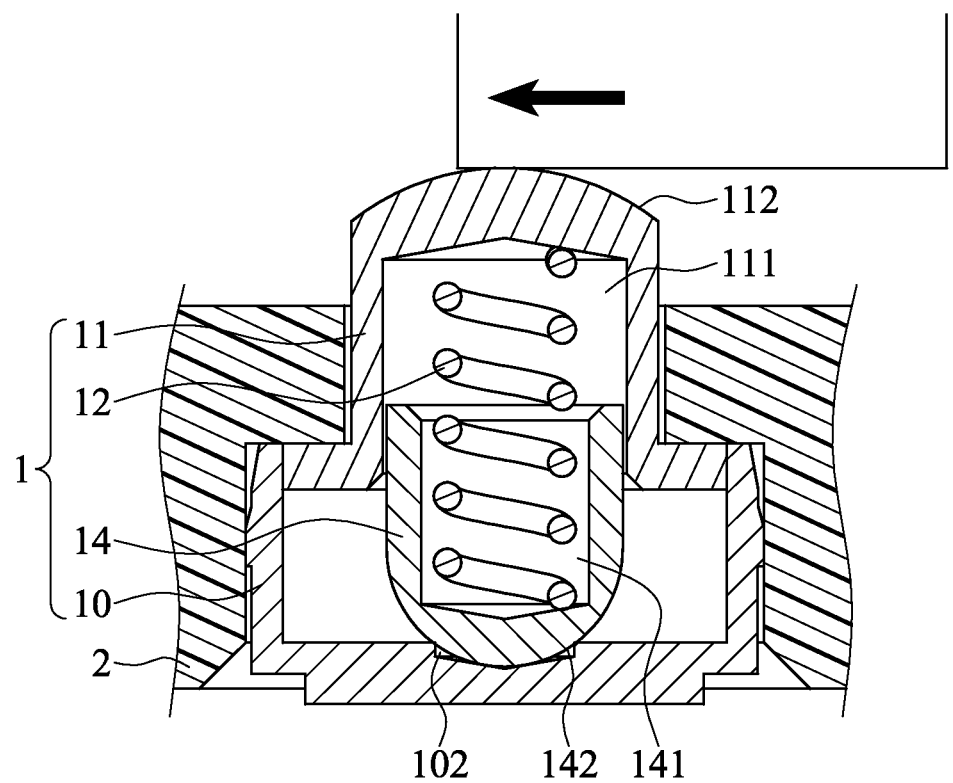
FIG. 3 is a first schematic view of an application of a preferred embodiment of the present invention.
Figure 4:
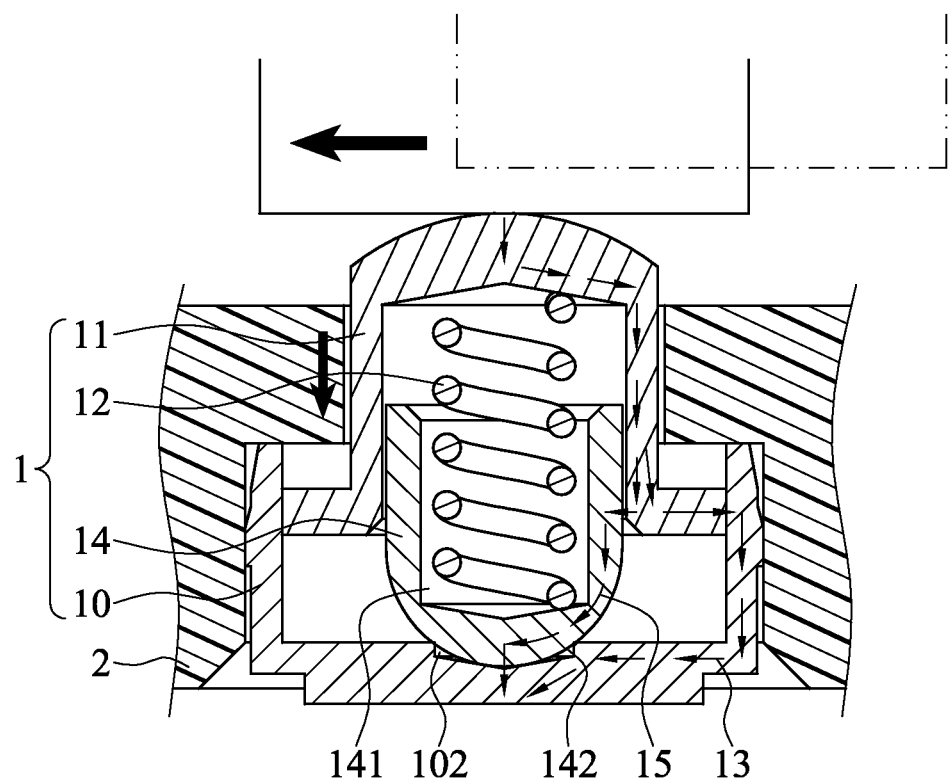
FIG. 4 is a second schematic view of an application of a preferred embodiment of the present invention.

The probe structure 1 of the present invention may be applied to a lateral connector or tester and comes with a miniaturized design. With the structural design of the present invention, the miniaturized components still maintain a good structural stability. If the probe structure 1 is applied in a connector or tester product, a connector base or a tester base may be installed easily to further improve the stability of the needle shaft 11. Since the present invention has an excellent structural stability, therefore the miniaturized needle shaft 11 may increases the curvature of the first contact portion 112 significantly to enhance the uniformity of the contact force with the needle shaft 11 and the stability of movements. In FIGS. 3 and 4, the probe structure 1 is used as a connector, and the probe structure 1 is installed in a connector base 2, such that when the probe structure 1 is plugged into a connector, a lateral sliding force is produced to the first contact portion 112 to move the needle shaft 11 towards the bottom of the sleeve 10 and touch an inner sidewall of the sleeve 10. In the meantime, an inner sidewall of the first groove 111 is in contact with an outer sidewall of the conductive component 14 to define the first conductive channel 13 and the second conductive channel 15, and the probe structure 1 improves the stability of contact by lateral forces. In FIG. 4, current flows from the first contact portion 112 along the needle shaft 11, and the edge of the needle shaft 11 is divided into two transmission paths, respectively: a path flowing from the sidewall of the sleeve 10 to the bottom of the sleeve 10 (which is the first conductive channel 13), and a path flowing along the sidewall of the conductive component 14 to the bottom of the sleeve 10 (which is the second conductive channel 15) to assure the electric conduction status of the probe structure 1 and reduce the influence by external forces.

In the probe structure 1 of the present invention, the conductive component 14, the needle shaft 11 and the sleeve 10 form the first conductive channel 13 and the second conductive channel 15 to provide two current transmission paths, and thus the present invention has the effects of improving the poor contact or disconnection problem caused by external vibrations and enhancing the stability of contact. In addition, the conductive component 14 can improve the stability of the overall structure to extend the service life and improve the using efficiency of the probe structure 1 effectively.

What is claimed is:

1. A probe structure, comprising a sleeve, a needle shaft and an elastic member, and the sleeve having an opening formed at an end and being sealed at the other end, and the needle shaft being accommodated in the sleeve and having a first groove, and an end of the elastic member being accommodated in the first groove, and the needle shaft being pressed to contact with an inner wall of the sleeve to define a first conductive channel, characterized in that the probe structure further comprises a conductive component installed at a bottom of the sleeve and having an end disposed in the first groove, and a second groove concavely formed on the conductive component, such that the elastic member is disposed in the first groove and the second groove, and when the needle shaft is pressed and moved, an inner sidewall of the second groove is in contact with an outer sidewall of the conductive component to define a second conductive channel.

2. The probe structure of claim 1, wherein the needle shaft has a first contact portion disposed at an end of the needle shaft opposite to the end having the first groove, and the first contact portion is in a convex arc shape.

3. The probe structure of claim 2, wherein the conductive component has a second contact portion disposed at an end of the conductive component opposite to the end having the second groove and contacted with a bottom surface of the sleeve.

4. The probe structure of claim 3, further comprising a conductive slot formed at a bottom surface of the sleeve and corresponsive to the second contact portion.

5. The probe structure of claim 2, further comprising a conductive slot formed at a bottom surface of the sleeve and corresponsive to the second contact portion.

* * * * *